(12) United States Patent
Mimino

(10) Patent No.: US 10,992,280 B2
(45) Date of Patent: Apr. 27, 2021

(54) WIRELESS COMMUNICATION APPARATUS

(71) Applicant: LAPIS Semiconductor Co., Ltd., Yokohama (JP)

(72) Inventor: Yutaka Mimino, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/830,237

(22) Filed: Mar. 25, 2020

(65) Prior Publication Data

US 2020/0313642 A1 Oct. 1, 2020

(30) Foreign Application Priority Data

Mar. 26, 2019 (JP) .............. JP2019-058190

(51) Int. Cl.
*H04B 5/00* (2006.01)
*H04B 1/40* (2015.01)
*H03H 7/38* (2006.01)
*H02J 50/20* (2016.01)
*H02J 50/40* (2016.01)
*H02J 50/80* (2016.01)
*H02J 50/12* (2016.01)
*H02J 7/02* (2016.01)
*H01Q 7/00* (2006.01)

(52) U.S. Cl.
CPC ............. *H03H 7/38* (2013.01); *H02J 7/02* (2013.01); *H02J 50/12* (2016.02); *H02J 50/20* (2016.02); *H02J 50/40* (2016.02); *H02J 50/80* (2016.02); *H04B 1/40* (2013.01); *H04B 5/0037* (2013.01); *H01Q 7/00* (2013.01)

(58) Field of Classification Search
CPC ...... H04B 1/005; H04B 1/006; H04B 1/0064; H04B 1/40; H04B 5/00; H04B 5/02; H04B 5/0025; H04B 5/0031; H04B 5/0037; H04B 5/0075; H04B 5/0081; H04B 5/0087; H04B 7/0602; H04W 4/20; H04W 4/80; H04W 88/00; H04W 88/02; H04W 88/06; H02J 7/02; H02J 7/025; H02J 50/00; H02J 50/10; H02J 50/12; H02J 50/20; H02J 50/80; H01Q 7/00
See application file for complete search history.

(56) References Cited

U.S. PATENT DOCUMENTS 8,410,637 B2 * 4/2013 Karaoguz ............ H04B 5/0037 307/104
9,673,660 B2 * 6/2017 Jung .................... H02J 7/04
(Continued)

FOREIGN PATENT DOCUMENTS

JP 2011217212 A 10/2011
JP 2017538377 A 12/2017

*Primary Examiner* — Quochien B Vuong
(74) *Attorney, Agent, or Firm* — Rabin & Berdo, P.C.

(57) ABSTRACT

A wireless communication apparatus which comprises: a shared antenna shared for communication and power reception; an impedance matching circuit connected to the shared antenna and having a first switch element; a communication circuit connected to the impedance matching circuit; a second switch element connected to the first switch element; and an impedance matching adjustment circuit configured to switch an on/off state of each of the first switch element and the second switch element at the time of communication and at the time of power reception.

3 Claims, 3 Drawing Sheets

(56) References Cited

U.S. PATENT DOCUMENTS

| | | | |
|---|---|---|---|
| 9,991,731 B2* | 6/2018 | Ichikawa | H02J 50/70 |
| 10,079,514 B2* | 9/2018 | Sone | H02J 7/00034 |
| 10,778,039 B2* | 9/2020 | Kim | H02J 50/12 |
| 2015/0065041 A1* | 3/2015 | Ahn | H04B 5/0037 |
| | | | 455/41.1 |

* cited by examiner

WIRELESS COMMUNICATION APPARATUS

CROSS-REFERENCE TO RELATED APPLICATION

This application is based upon and claims the benefit of priority from the prior Japanese Patent Application No. 2019-058190 filed on Mar. 26, 2019, the entire contents of which are incorporated herein by reference.

BACKGROUND OF THE INVENTION

1. Field of the Invention

The present invention relates to a wireless communication apparatus for performing communication and power reception in a non-contact manner.

2. Description of the Related Art

There is known a communication apparatus which includes non-contact transmitting and receiving devices, and which operates under the Qi standard (which is a wireless power transfer standard developed by WPC (Wireless Power Consortium)) using a frequency band of 110 kHz to 205 kHz. Further, there are also known NFC (Near Field Communication) standards used for short-range communication. Recently, a mobile communication apparatus (hereinafter referred to as an NFC apparatus) such as an NFC earphone or an NFC touch pen has been developed by taking advantage of the advantage that an antenna can be miniaturized by NFC using a frequency (13.56 MHz band) higher than the frequency band used for Qi. Power is supplied to the mobile communication apparatus by NFC to charge a battery (see Japanese Patent Kokai No. 2017-538377). In addition, there has been already developed an antenna automatic adjustment apparatus which changes a frequency and a circuit constant according to an impedance change (see Japanese Patent Kokai No. 2011-217212).

SUMMARY OF THE INVENTION

In the mobile communication apparatus, the transmitting device uses a battery (secondary battery). Therefore, there is a strong demand to extend the operation time of the battery of the transmitting device by lowering the transmission power at the time of communication. In the receiving device, in order to shorten the charging time of the battery at the time of power reception, the impedance of a matching circuit is decreased to flow a large current and, at the communication time, the impedance is increased to reduce the current. Since the impedance is low at the power reception time, unless the impedance matching circuit between an antenna and a circuit is switched at each of the communication time and the power reception time, there has been a problem that unnecessary reflected waves are generated, resulting in a decrease in a communicable distance at the communication time and a decrease in power supply amount at the power reception time.

In view of the aforementioned problem, it is an object of the present invention to provide a wireless communication apparatus capable of appropriately matching impedances between a shared antenna used in the wireless communication apparatus and a circuit connected to the antenna.

According to the present invention, a wireless communication apparatus comprises: a shared antenna shared for communication and power reception; an impedance matching circuit connected to said shared antenna and having a first switch element; a communication circuit connected to said impedance matching circuit; a second switch element connected to said first switch element; and an impedance matching adjustment circuit configured to switch an on/off state of each of said first switch element and said second switch element at the time of communication and at the time of power reception.

According to the present invention, it is possible to realize a wireless communication apparatus capable of appropriately performing impedance matching between a shared antenna and a circuit connected thereto.

DETAILED DESCRIPTION OF THE INVENTION

Figure 1:
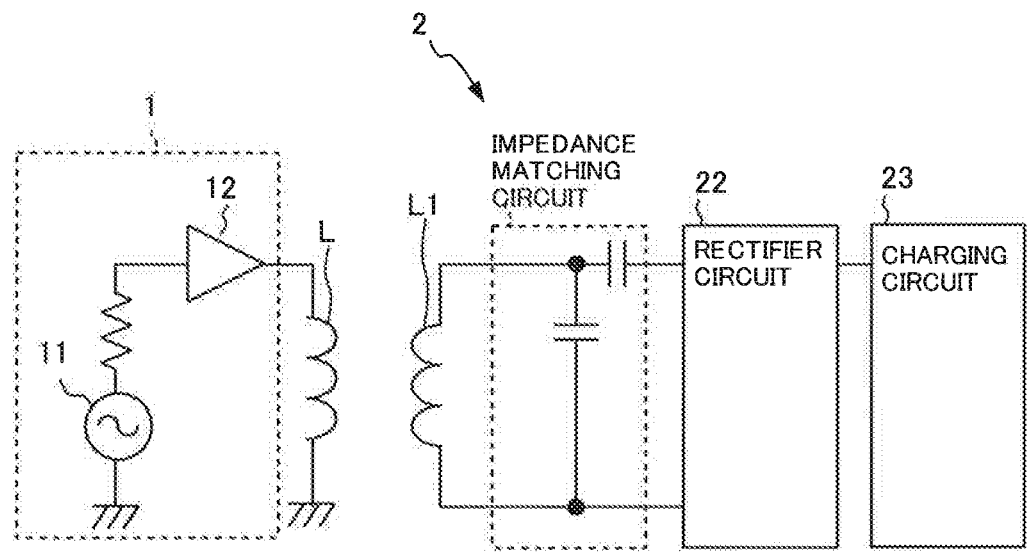
FIG. 1 is a block diagram of an NFC device system.

The embodiments of the present invention will now be described in detail with reference to the accompanying drawings. In the following description of each of the embodiments, components having substantially the same functions and configurations are denoted by the same reference numerals, and thereby redundant description will be omitted.

First an NFC apparatus system will be described with reference to FIG. 1 and FIG. 2. FIG. 1 shows an example of the NFC device system. A transmitting device 1 includes, for example, an oscillator 11, a power transmission amplifier 12, and an antenna L. The transmitting device 1 is configured to further include, for example, a power supply circuit, a control circuit, a communication unit, and so on, although the power supply circuit, the control circuit, the communication unit, and so on are omitted and not shown. Further a communication unit (not shown) may be configured to perform wireless communication (NFC communication) via the antenna L, or the communication unit may perform the NFC communication by separately providing another dedicated antenna. For example, communication concerning authentication data for authenticating whether or not a power receiving device 2 is a transmission target of the transmitting device 1, communication concerning a notification of power reception for notifying whether or not the power receiving device 2 has received power that transmitted from the transmitting device 1, and so on are performed by the NFC communication. Further, the control circuit (not shown) performs NFC communication with the power receiving device 2 via the antenna L thereby communicating information on the remaining amount of a battery (not shown) in the power receiving device 2 and various information for contactless power feeding, resulting in determining the amount of power to be transmitted. The control circuit adjusts an amplification factor of the power transmission amplifier 12 in accordance with the determined amount of power. As a result, transmission power according to the amount of power to be transmitted is sent out from the transmitting device 1.

The transmitting device 1 transmits a high-frequency signal through the antenna L of a coil to a shared antenna L1 of a coil which is shared by communication and power reception of the receiving device 2. Many NFC antennas transmit high-frequency signals from the transmitting device 1 to the receiving device 2 by magnetic field coupling using their coils. The intensity of the high-frequency signal transmitted from the transmitting device 1 at the time of communication is smaller than that of at the time of power supply. The receiving device 2 after receiving the high-frequency signal converts the high-frequency signal from the shared antenna L1 through an impedance matching circuit 21 into a direct current by a rectifier circuit 22, and generates power for the operation of the device itself. The signal strength for operating the receiving device 2 may be, for example, a signal strength as small as 1 mW, which is sufficient to allow a communication circuit (not shown) to operate at the time of communication, on the other hand, power of several hundred milliwatts to several watts is required at the time of power reception. In the communication with low power consumption and the power reception operation with high power consumption, since impedances of the rectifier circuit 22 and the communication circuit are changed, impedance mismatching is caused unless the impedance matching circuit 21 adjusting impedances between the antenna L1 and the circuits.

Therefore, a circuit for changing the impedance of the impedance matching circuit 21 is provided in the receiving device. A power for operating the particular circuit is required at the time that operation is started. In a wireless communication and power supply, most of internal circuits cannot be activated, if there is not enough power left in the power supply to operate the internal circuits in the power receiving side (hereinafter referred to simply as "no power supply"). Therefore, the circuit for changing the impedance of the impedance matching circuit cannot be operated. It seems that the impedance matching circuit that matches the impedance of the antenna at the start of operation may be used. However, it is not possible to match the impedance at the start of operation from the procedure of the wireless communication and power supply.

For example, the procedure of the wireless communication and power supply is described. The transmitting device 1 first checks whether or not the receiving device 2 is closely present at the start of the operation. That is, in the receiving side, there is a possibility that a device that is not an NFC device exists. Since transmitting a large power first may destroy a device that is not the NFC device in the receiving side, the transmitting device 1 confirms the presence of the receiving device 2 of the NFC device with a small signal.

Therefore, since the receiving device 2 in the first embodiment described later receives a small signal, a state where the impedance of the impedance matching circuit is high is set as an initial value.

Figure 2:
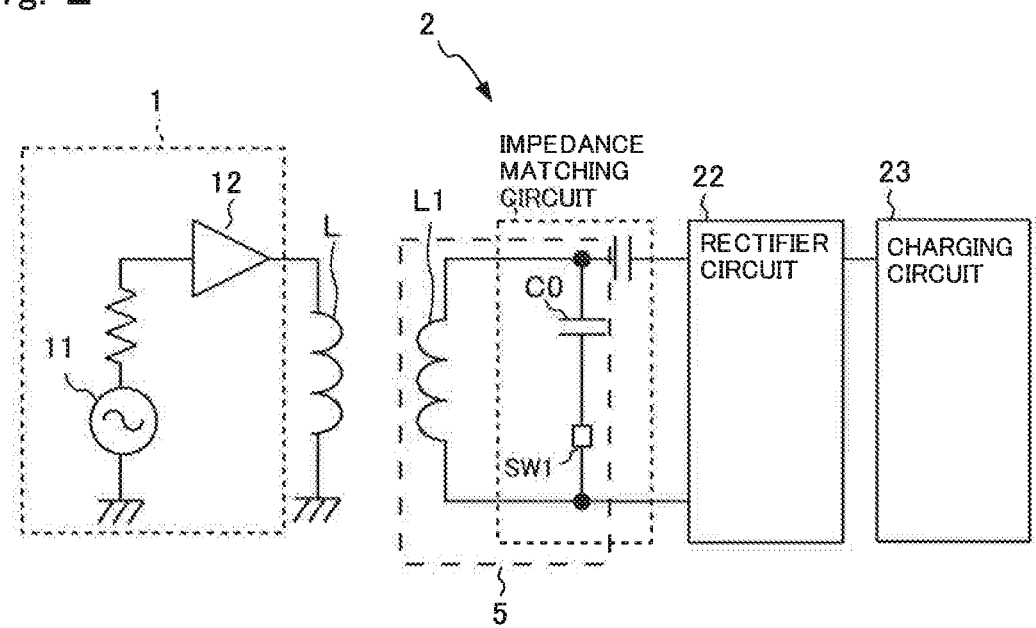
FIG. 2 is a block diagram of another NFC device system.

FIG. 2 shows another example of the NFC device system, in which a circuit for changing the impedance of the impedance matching circuit 21 is added to the configuration shown in FIG. 1. In the circuit, in order to increase the impedance, a capacitor C0 for resonance is arranged in parallel with the shared antenna L1 of the coil, so that a high impedance is realized by parallel resonance. In order to decrease the impedance, a switch element SW1, which is connected in series to the capacitor C0, is turned off to stop the parallel resonance, so that a low impedance is realized. In order to improve the operating speed of the impedance matching circuit 21 and to reduce the circuit area, a semiconductor switch is used for the switch element SW1 rather than a mechanical relay switch. Since a peak voltage applied to the shared antenna L1 of the coil is relatively high in the case of the NFC device, if a PMOS transistor is used as the switch element SW1, it is difficult to raise the gate voltage of the PMOS transistor so that the PMOS transistor can be turned off. Therefore, an NMOS transistor, whose drain and source terminals are connected in series to the capacitor C0, is used for the switch element SW1 in a resonant circuit 5.

Thus, in order to increase the impedance at the start of a communication operation, the switch element SW1 of the NMOS transistor is turned on to realize the parallel resonance state with the coil. However, at the start of the communication operation, since the receiving device 2 is in no power supply, the switch element SW1 cannot be turned on, so that a small signal at the time of communication cannot be received. Further, since ideal impedance matching conditions are not satisfied for both communication and power reception, an intermediate impedance matching condition between communication and power reception must be selected. Therefore, there is a possibility that a communicable distance is shortened or a power supply amount is reduced.

Next, a wireless communication apparatus of a first embodiment will be described.

First Embodiment

Figure 3:
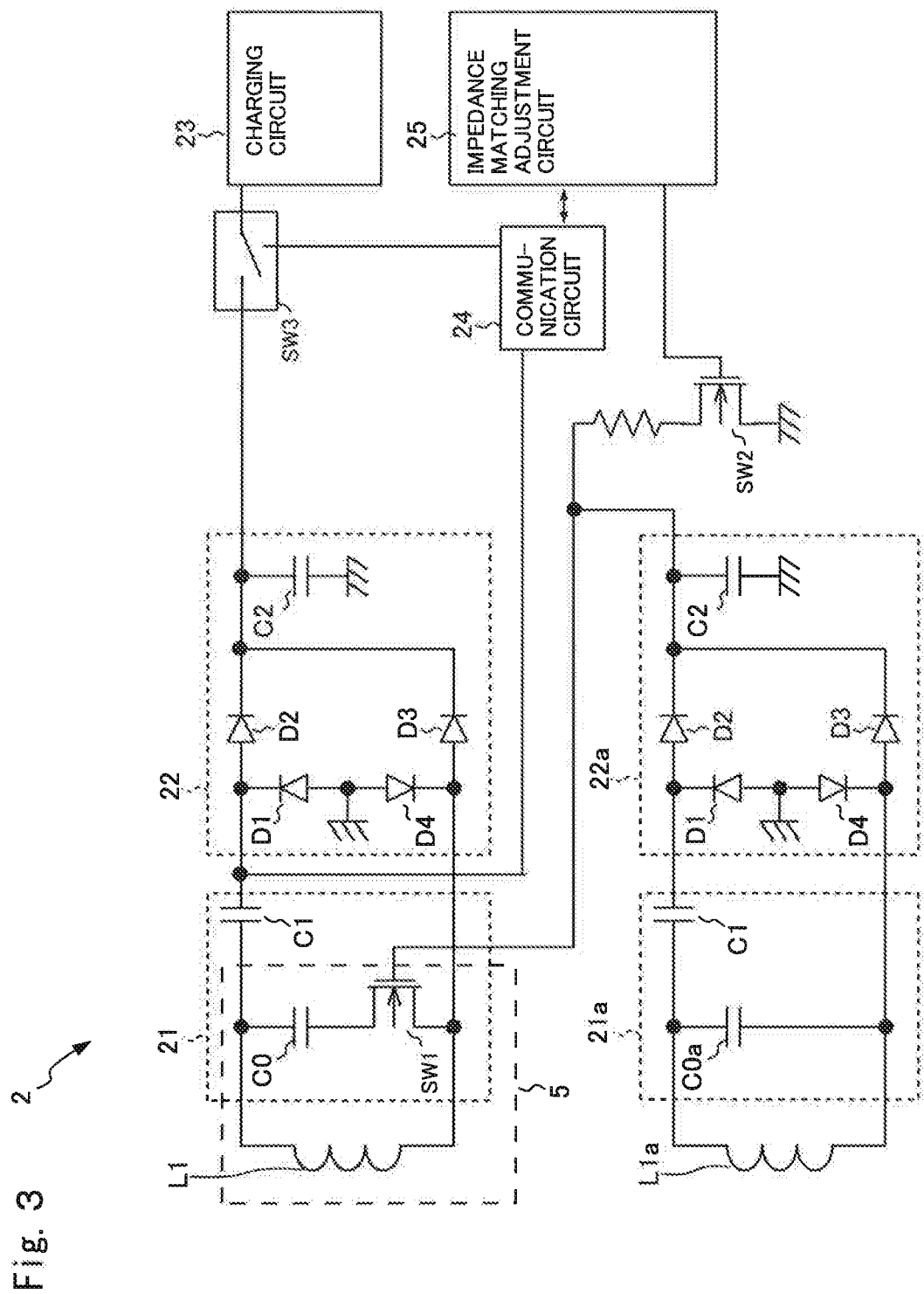
FIG. 3 is a schematic block diagram of a wireless communication apparatus of a first embodiment.

FIG. 3 schematically shows a circuit diagram of the wireless communication apparatus of the first embodiment. A power receiving device 2 of the wireless communication apparatus is a device capable of transmitting and receiving data by NFC communication, charging a battery (not shown) by non-contact power supply, and the like. The power receiving device 2 includes a shared antenna L1 common to antennas used for the NFC communication and the wireless power supply in an electromagnetic resonance system. The power receiving device 2 is used in such a manner that the shared antenna L1 is switched between the NFC communication and the power reception.

The power receiving device 2 includes the shared antenna L1, an impedance matching circuit 21, a rectifier circuit 22, a switch circuit SW3, and a charging circuit 23 which are connected in that order. Further, the power receiving device 2 includes a communication circuit 24, and the communication circuit 24 is connected to an impedance matching circuit 21. The power receiving device 2 is configured to include an internal circuit (not shown). The charging circuit 23 includes a battery (not shown) for charging. When the power receiving device 2 is, for example, a smartphone, the internal circuit is an electronic circuit for realizing functions of the smartphone. The impedance matching circuit 21 includes a capacitor C0, a switch element SW1, and a capacitor C1. The shared antenna L1 and the capacitor C0 constitute a resonant circuit 5.

The power receiving device 2 includes an auxiliary power receiving antenna L1a, an auxiliary impedance matching circuit 21a connected to the auxiliary power receiving antenna L1a, an auxiliary rectifier circuit 22a connected to the auxiliary impedance matching circuit 21a, an auxiliary switch element SW2 for supplying power from the auxiliary rectifier circuit 22a to the switch element SW1 when it is turned on, and an impedance matching adjustment circuit 25 for performing on/off control for the auxiliary switch element SW2. The auxiliary impedance matching circuit 21a includes an auxiliary capacitor C0a and a capacitor C1.

The switch element SW1 is an NMOS transistor in which the drain and source terminals thereof are connected in series to the capacitor C0 in the resonant circuit 5. The auxiliary switch element SW2 is an NMOS transistor in which the drain and source terminals thereof are connected to a connection point between the gate of the switch element SW1 and an output of the auxiliary rectifier circuit 22a and in which the gate is connected to the impedance matching adjustment circuit 25.

The auxiliary power receiving antenna L1a, the auxiliary impedance matching circuit 21a, the auxiliary switch element SW2, and the impedance matching adjustment circuit 25 are provided for on/off-controlling the switch element SW1 in the impedance matching circuit 21. The impedance matching adjustment circuit 25 controls the switch element SW2 by the auxiliary switch element SW1 to cause the auxiliary power receiving antenna L1a and the auxiliary capacitor C0a to resonate in parallel, thereby increasing the impedance to reduce a consumption current, and then suppressing generation of useless power loss.

In this manner, the shared antenna L1, and the capacitor C0 in the impedance matching circuit 21 configure a resonance circuit of a secondary side, and generate an electromotive force (AC signal) by the magnetic field coupling action generated by the transmitting device 1 (see FIG. 2).

In the impedance matching circuit 21, its impedance is adjusted by changing the on/off state of the switch element SW1. By adjusting the impedance of the impedance matching circuit 21, the magnetic field from the transmitting device 1 (see FIG. 2) can be efficiently received. The capacitor C1 in the impedance matching circuit 21 is provided for matching the impedance of the impedance matching circuit 21 when viewing from the impedance matching circuit 21.

The rectifier circuit 22 rectifies an AC voltage (AC signal) according to electric power received via the impedance matching circuit 21 to obtain a DC output voltage. The rectifier circuit 22 is, for example, a full-wave rectifier circuit. Although not particularly limited, the rectifier circuit 22 includes a diode bridge circuit composed of Schottky diodes D1 to D4 and a smoothing capacitor C2. In the diode bridge circuit, one input terminal corresponding to a connection point between the diode D1 and the diode D2 is connected to the capacitor C1 in the impedance matching circuit 21.

In the diode bridge circuit, one end of the smoothing capacitor C2 is connected to an output terminal corresponding to a connection point between the diode D3 and the diode D2. The smoothing capacitor C2 smoothes the voltage rectified by the diode bridge circuit. Based on a rectified voltage at the one end of the smoothing capacitor C2, the operation of each functional part in the power receiving device 2 is enabled. The other end of the smoothing capacitor C2 is grounded.

The communication circuit 24 performs NFC communication with the transmitting device 1 (see FIG. 2) by using the shared antenna L1 as a communication antenna. The communication circuit 24 performs on/off control of the switch circuit SW3. The switch circuit SW3 is turned on during a period other than an NFC communication period of the communication circuit 24, to supply electric power to the charging circuit 23.

(Operation of the Apparatus)

A signal sent from the transmitting device 1 (see FIG. 2) is input to the shared antenna L1 and the auxiliary power receiving antenna L1a. The signal input from the auxiliary power receiving antenna L1a is converted into a DC voltage by the auxiliary rectifier circuit 22a, and is input to the gate of the switch element SW1 for switching in the impedance matching circuit 21, thereby turning on the switch element SW1.

When the switch element SW1 is turned on, the shared antenna L1 and the capacitor C0 satisfy the condition of parallel resonance, and the communication circuit 24 starts operation. When the operation of the communication circuit 24 is started, communication between the transmitting device 1 and the receiving device 2 is started, and then when the presence of the communication device is confirmed in the transmitting device 1, large power for charging is transmitted from the transmitting device 1, and power supply starts.

The impedance matching adjustment circuit 25 monitors the communication circuit 24 in the receiving device 2 at the same time as the start of the power supply. In response to the operation of the communication circuit 24, the impedance matching adjustment circuit 25 turns on the auxiliary switch element SW2 to decrease a potential of the gate of the switch element SW1, so that the switch element SW1 is turned off to obtain an impedance matching state for the power reception by decreasing the impedance of the shared antenna L1 side. When the power supply operation is completed, the impedance matching adjustment circuit 25 turns off the auxiliary switch element SW2 without gate-bias in accordance with the operation of the communication circuit 24, whereby the impedance of the shared antenna L1 can be increased, and then communication can be started again.

According to the first embodiment, the impedance matching adjustment circuit 25 controls the on/off of the switch element SW1 via the auxiliary switch element SW1, thereby making it possible to obtain an optimum impedance matching condition for each of the communication state and the power supply state of the impedance matching circuit 21, and to realize an increase in a communicable distance and an increase in a power supply amount.

Second Embodiment

Figure 4:
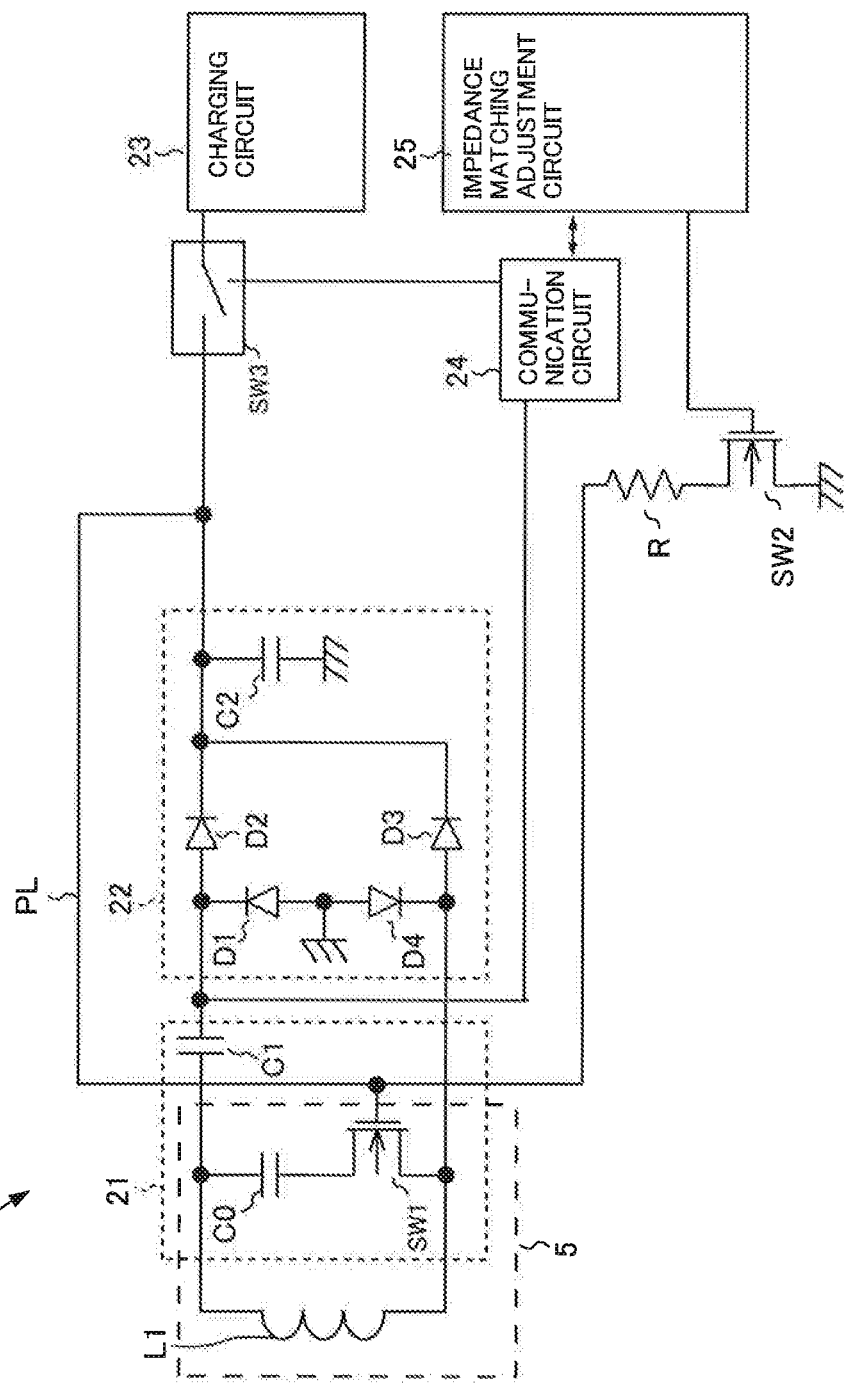
FIG. 4 is a schematic block diagram of a wireless communication apparatus of a second embodiment.

FIG. 4 schematically shows a circuit diagram of a wireless communication apparatus of a second embodiment. A power receiving device 2A of the wireless communication apparatus does not include the auxiliary power receiving antenna L1a, the impedance matching circuit 21a, and the auxiliary rectifier circuit 22a which are included in the first embodiment. Instead of them, the power receiving device 2A includes a power line PL for supplying electric power by the rectifier circuit 22 to the gate of the switch element SW1. The impedance matching adjustment circuit 25 controls the gate potential of the switch element SW1 via a resistance by turning-on/off the auxiliary switch element SW2. Other configurations in the second embodiment are the same as those of the first embodiment.

When there is no power line PL, the switch element SW1 is turned off since the receiving device 2 is in no power supply, at the start of the operation, so that the shared antenna L1 and the resonant capacitor C0 cannot be brought into parallel resonance state. Therefore, in the second embodiment, although an output of the rectifier circuit 22 cannot obtain a voltage sufficient to activate the communication circuit 24 of the receiver 2, if the power line PL is provided and an NMOS transistor having a low threshold voltage is used as the switch SW1, the switch SW1 can be turned on. When the switch element SW1 of the NMOS is turned on, the shared antenna L1 and the resonance capacitor C0 are in a parallel resonance state, and a voltage sufficient to operate a series of circuits in the receiving device 2 can be generated.

In the second embodiment, in addition to the effect of the first embodiment, each of the antenna coil and the rectifier circuit used in the receiving device 2 is one, so that an area of the circuits can be reduced. Since the voltage obtained from the rectifier circuit 22 at the start of operation is lower than that of the first embodiment, it is preferable to use as the switch element SW1 an NMOS transistor having a threshold voltage lower than that of the switch element SW2 for switching the circuit used in the first embodiment.

What is claimed is:

1. A wireless communication apparatus comprising:
   a shared antenna shared for communication and power reception;
   an impedance matching circuit connected to said shared antenna and having a first switch element;
   a communication circuit connected to said impedance matching circuit;
   a second switch element connected to said first switch element; and
   an impedance matching adjustment circuit configured to switch an on/off state of each of said first switch element and said second switch element at the time of communication and at the time of power reception.

2. The wireless communication apparatus according to claim 1, further comprising:
   a rectifier circuit connected to said impedance matching circuit;
   an auxiliary power receiving antenna;
   an auxiliary impedance matching circuit connected to said auxiliary power receiving antenna; and
   an auxiliary rectifier circuit connected to said auxiliary impedance matching circuit, and configured to supply electric power to said first switch element.

3. The wireless communication apparatus according to claim 1, further comprising a rectifier circuit connected to said impedance matching circuit, and configured to supply electric power to said first switch element.

* * * * *